(12) United States Patent
Tobori

(10) Patent No.: US 10,734,359 B2
(45) Date of Patent: Aug. 4, 2020

(54) WIRING WITH EXTERNAL TERMINAL

(71) Applicant: Micron Technology, Inc., Boise, ID (US)

(72) Inventor: Hidenori Tobori, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/108,644

(22) Filed: Aug. 22, 2018

(65) Prior Publication Data

US 2020/0066681 A1 Feb. 27, 2020

(51) Int. Cl.
*H01L 23/522* (2006.01)
*H01L 25/065* (2006.01)
*H01L 23/00* (2006.01)
*H01L 23/538* (2006.01)

(52) U.S. Cl.
CPC ...... *H01L 25/0657* (2013.01); *H01L 23/5226* (2013.01); *H01L 23/5386* (2013.01); *H01L 23/562* (2013.01)

(58) Field of Classification Search
CPC .................................................. H01L 23/522
See application file for complete search history.

(56) References Cited

U.S. PATENT DOCUMENTS

| 4,060,828 A * | 11/1977 | Satonaka ............... H01L 21/312 257/774 |
| 2008/0111223 A1* | 5/2008 | Yu ........................ H01L 23/3114 257/678 |
| 2017/0062362 A1* | 3/2017 | Sekikawa ................ H01L 24/05 |
| 2017/0365587 A1* | 12/2017 | Hung ................... H01L 23/5386 |

* cited by examiner

*Primary Examiner* — Peniel M Gumedzoe
*Assistant Examiner* — Christopher A Johnson
(74) *Attorney, Agent, or Firm* — Dorsey & Whitney LLP

(57) ABSTRACT

Apparatuses for providing external terminals of a semiconductor device are described. An example apparatus includes a first group of wiring layers of an internal redistributing layer (iRDL) providing a power supply voltage and a second group of wiring layers of another iRDL providing a ground voltage. The first group of wiring layers providing the power supply voltage from a first side of the semiconductor device to a second side of the semiconductor device opposite to the first side are at least partially separated by at least one cut portion between the first side and the second side.

20 Claims, 9 Drawing Sheets

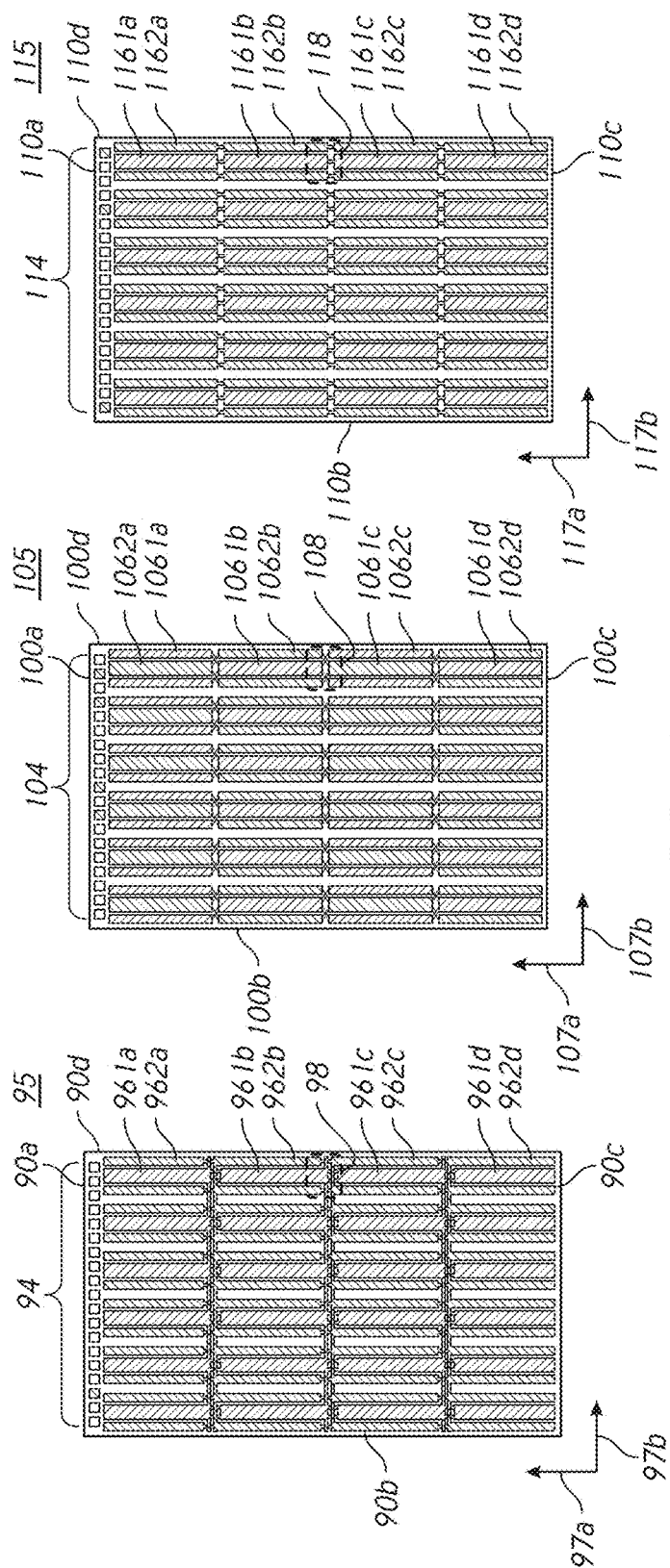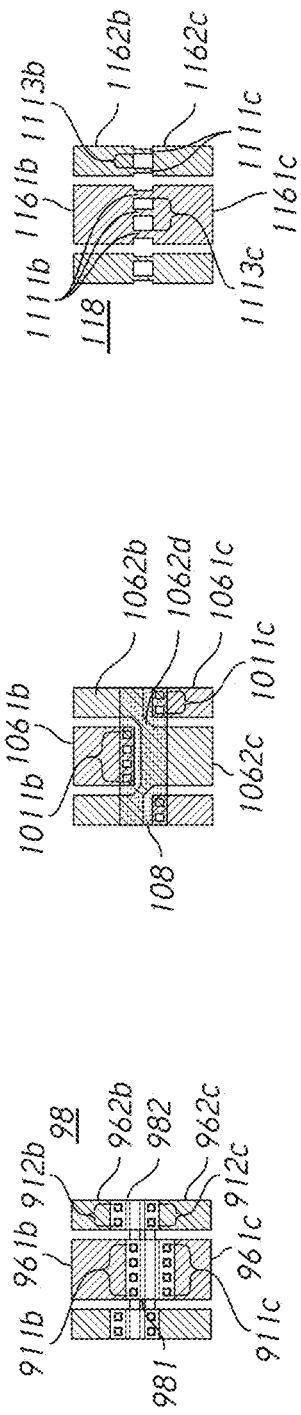

WIRING WITH EXTERNAL TERMINAL

BACKGROUND

High data reliability, high speed of memory access, reduced chip size and reduced power consumption are features that are demanded from semiconductor memory. To achieve reduced power consumption and higher memory access speed, a redistribution layer (RDL), a metal layer that provides low impedance and high conductivity has been increasingly used in semiconductor memory devices, to couple, for example, pads and data queue circuits (or data input/output circuits) across layers. Thin package products including multiple chips stacked thereon have been increasingly used. In a thin package product, the RDL increases the thickness of a laminated material on a board.

To construct a package or chip stack with a reduced height, the thickness of each chip must be reduced. To reduce the thickness of each chip to achieve a desired chip thickness, a back surface of a wafer that provide chips may be processed by a back grinding process. Because the thickness of the RDL accounts for approximately 10% of the entire chip thickness, distortion of the RDL that affects the warpage of the chip becomes non-negligible as the wafer is thinned by back grinding. Thus, the thickness of a wafer providing chips has been reduced as desired, the warpage of the chip in the product due to the distortion of the RDL has become a major problem.

For example, forming a thin film on a flat wafer creates a mechanical stress applied to the wafer, and to reduce this stress, the wafer warps. FIG. 1 is a schematic diagram of warpage of a wafer and a thin film in a conventional semiconductor device while forming the thin film on the wafer. First, the thin film is formed in a high-temperature as shown in the top. After the thin film is formed, an ambient temperature of the wafer with the film is lowered to a room temperature, as shown in the middle. Because there is a difference in coefficient of thermal expansion (CTE) between the wafer and the thin film, the difference in CTE causes the wafer to be distorted in a manner to bend towards the thin film, which causes the stress on the thin film and the thin film also becomes distorted as shown in the bottom.

FIG. 2 is a layout diagram of wiring layers of RDLs 6 in a conventional semiconductor device 5. The conventional semiconductor device 5 is a chip. The wiring layers of RDLs 6 are connected to major power supply lines, such as a power supply voltage line and a ground voltage line. Some other power supply lines (e.g., a partial power supply voltage VDD2, etc.) are also be connected to the wiring layers of RDLs 6, but they are thinner than the major power supply lines. When pads 24a are arranged along an upper side 2a and pads 24b are arranged on a lower side 2c of the chip 5, the wiring layers of RDLs 6 coupled to the pads 24a and 24b inevitably have an elongated shape extending in a first direction of 7a along sides 2b and 2d, perpendicular to and longer than the sides 2a and 2c extending in a second direction 7b. Thus, the wiring layers of RDLs 6 supply the power supply voltages from the pads 24a and 24b to an array of internal elements. Being thick RDLs in an uppermost layer close to the surface of the chip 5, the wiring layers of RDLs have stress greater than stresses of internal metal layers (i.e. lower layers made of aluminum or copper etc.) of the chip 5. When the wiring layers of RDLs 6 are elongated in the first direction 7a, therefore, the large stress of the wiring layers of RDLs 6 pull the upper and lower pads 24a and 24b toward each other. The wafer warps along the first direction 7a of the chip 5. Even if the chip 5 is in a square shaper, stress arises in the direction of the uppermost wiring layers of the RDLs, causing the wafer to warp towards the surface of the chip 5.

FIG. 3A is a layout diagram of wiring layers of RDLs with a dicing diagonally rotated in a wafer plane with respect the wiring layer of RDLs in a conventional semiconductor device. FIG. 3B is a schematic diagram of warpage in the conventional semiconductor device. Dicing the wafer along 45-degree dicing lines as shown in FIG. 3A results in the diagonal warpage of the chip as shown in FIG. 3B. Diagonal corners close to longer wiring layers of the RDLs tend to have greater warpages whereas the other two diagonal corners closet to shorter wiring layers of the RDLs tend to have less warpages. The greater diagonal warpage close to the longer wiring layers of the RDLs is caused by stress along the direction of a pattern of RDLs wiring layers and other patterns in the chip not by the chip shape.

FIG. 4A is a layout diagram of an uppermost wiring layer in a conventional semiconductor device 45. FIG. 4A is a plan view of the uppermost wiring layer of the conventional semiconductor device 45. The semiconductor device 45 may have sides 40a to 40d. The sides 40b and 40d opposite to each other with respect to the conventional semiconductor device 45, extending in a first direction 47a. The sides 40a and 40c opposite to each other with respect to the semiconductor device 45, extending in a second direction 47b, which is perpendicular to the first direction 47a. The semiconductor device 45 including the uppermost wiring layer is a one-channel mobile dynamic random access memory (DRAM). The uppermost wiring layer of the semiconductor device 45 includes a plurality of pads 44, such as power terminals or data terminals, which are arranged in the second direction 87b along the side 40a extending in the first direction. The uppermost wiring layer of the semiconductor device includes wiring layers 461 and 462 made of redistribution layers (e.g., internal redistribution layers (iRDL)) extending along the first direction 47a in parallel to the sides 40b and 40d. The wiring layers 461 is coupled to a power supply wire for providing a power supply voltage VDD from a power pad that receives the power supply voltage VDD. The wiring layers 462 is coupled to another power supply wire for providing a power supply voltage VSS (e.g., a ground voltage) that is lower than the power supply voltage VDD from another power pad that receives the power supply voltage VSS. The power supply wiring layers 461 and 462 for providing the power supply voltage VDD and VSS may have greater thicknesses than other power supply wires (e.g., power supply wire that provides a partial power supply voltage VDD2) that are coupled to another wiring layers of RDLs. The warpage due to the stress along the wiring layers of RDLs 461 and 462 extending from the side 40a to the side 40c along the sides 40b and 40c in the first direction 47a are great and non-negligible as explained earlier. FIG. 4B is a schematic diagram of the uppermost wiring layer in the conventional semiconductor device 45.

As described above, the warpage is affected by physical property of the wafer, the aspect ratio of the chip, and the direction of layout patterns. Because the RDLs and a passivation layer made of polyimid (PI) and covering the RDL, both having greater thicknesses extend in the uppermost layer closer to the surface, stress and distortions of the PI layer and the RDL affect greatly to the warpage of a semiconductor device. Thus, a greater thickness of the RDL distorts the chip that is undesirable to reduce the chip size in thickness.

BRIEF DESCRIPTION OF THE DRAWINGS

FIG. 9A is a layout diagram of wiring layers of RDLs in the semiconductor device in accordance with an embodiment of the present disclosure.

FIG. 9B is a layout diagram of a cut portion coupling the wiring layers of RDLs in the semiconductor device in accordance with an embodiment of the present disclosure.

FIG. 10A is a layout diagram of wiring layers of RDLs in the semiconductor device in accordance with an embodiment of the present disclosure.

FIG. 10B is a layout diagram of a portion of the wiring layers of RDLs in the semiconductor device in accordance with an embodiment of the present disclosure.

FIG. 11A is a layout diagram of wiring layers of RDLs in the semiconductor device in accordance with an embodiment of the present disclosure, FIG. 11B is a layout diagram of a portion of the wiring layers of RDLs in the semiconductor device in accordance with an embodiment of the present disclosure.

FIG. 12 is a layout diagram of a portion of wiring layers of RDLs in a semiconductor device in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
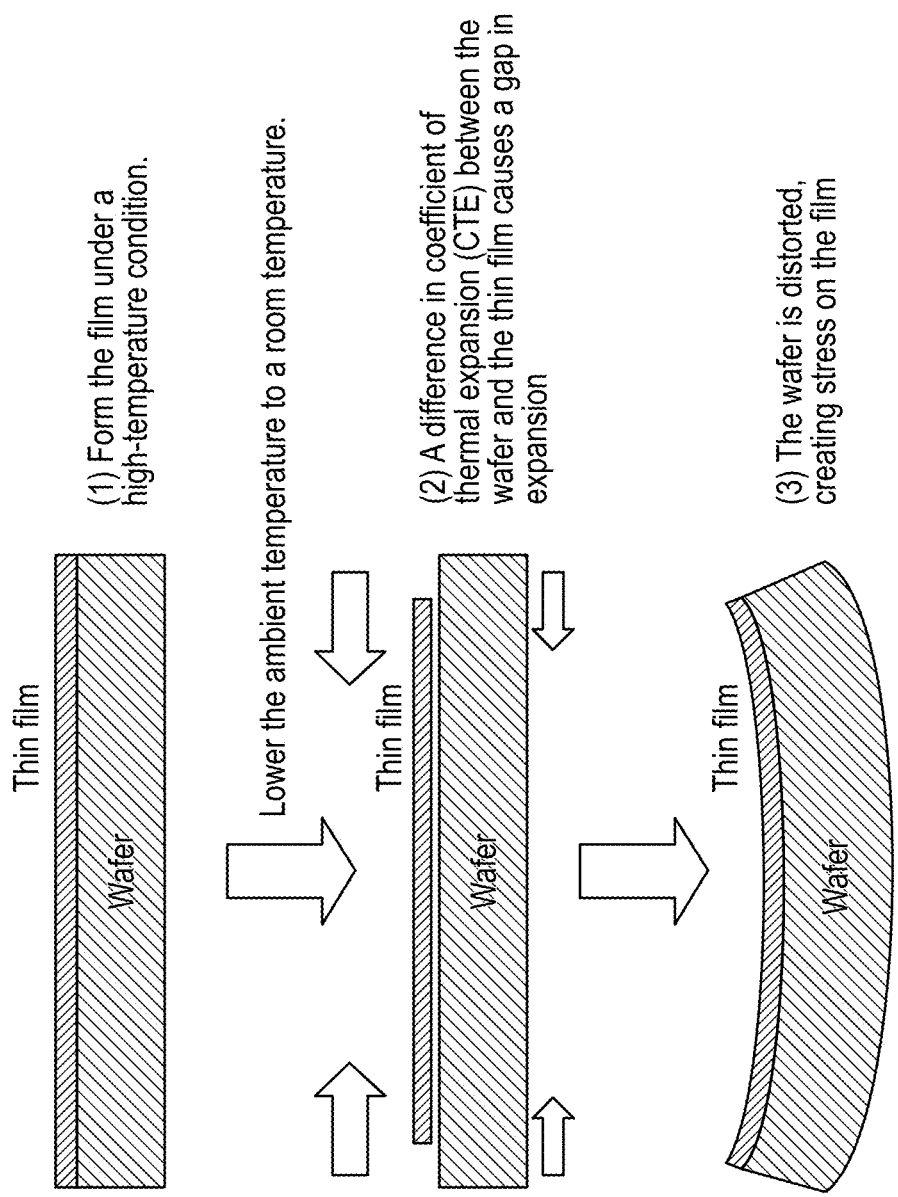
FIG. 1 is a schematic diagram of warpage of a wafer and a thin film in a conventional semiconductor device.
Figure 2:
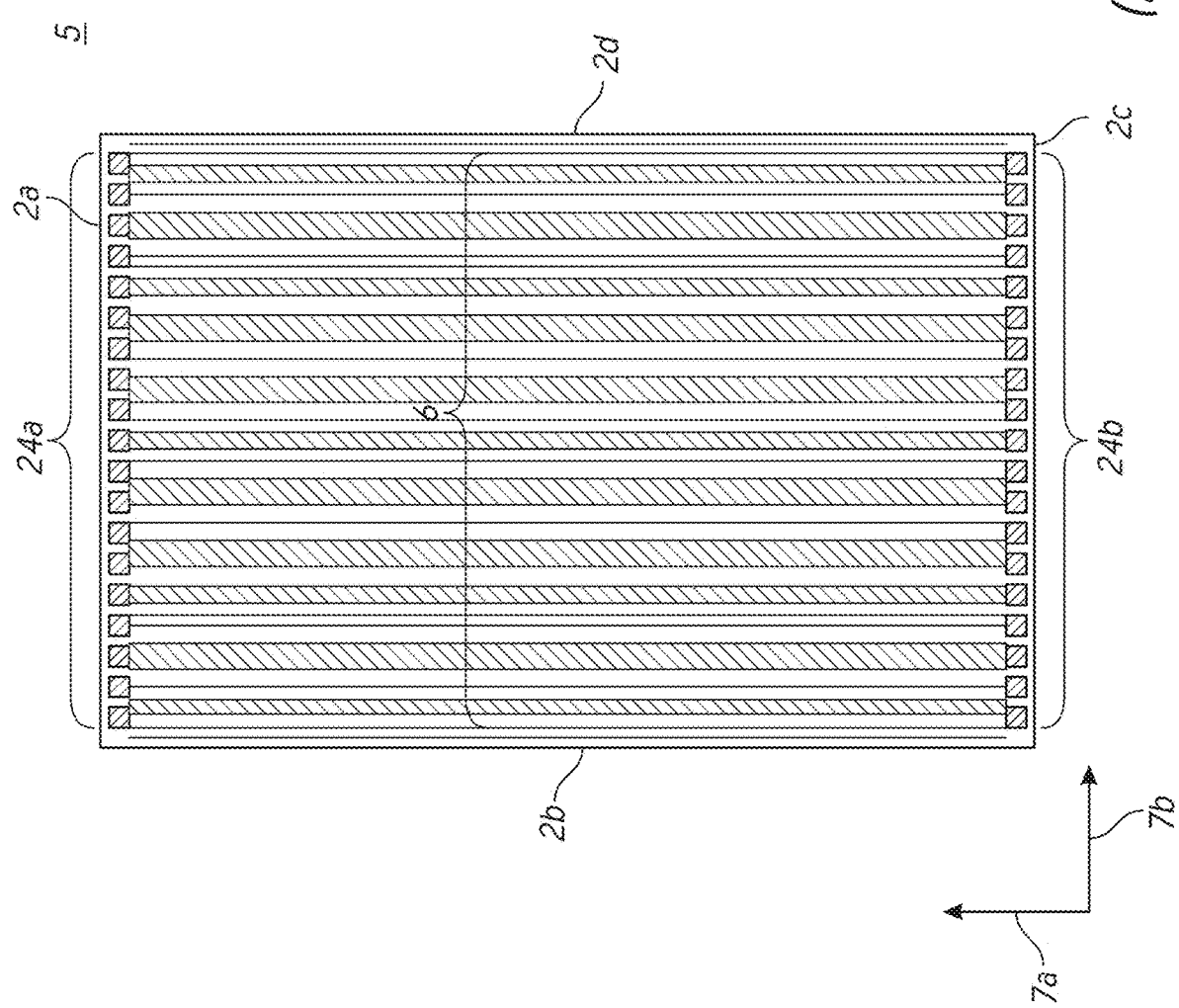
FIG. 2 is a layout diagram of wiring layers of RDLs in a conventional semiconductor device.
Figure 3B:
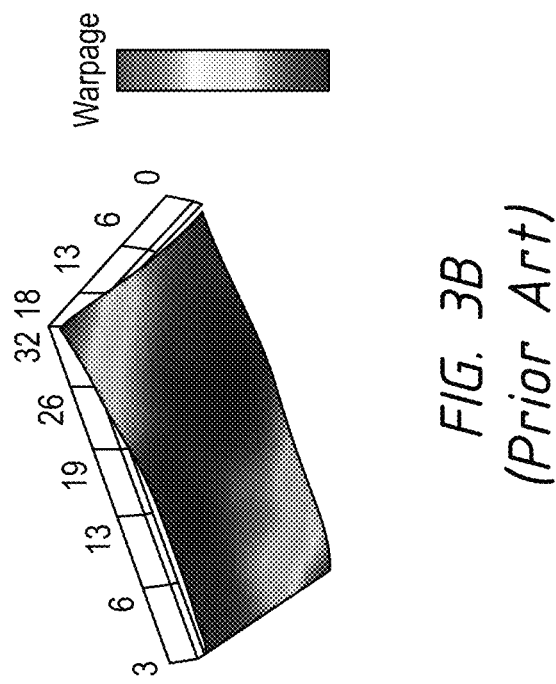
FIG. 3B is a schematic diagram of warpage in the conventional semiconductor device.
Figure 3A:
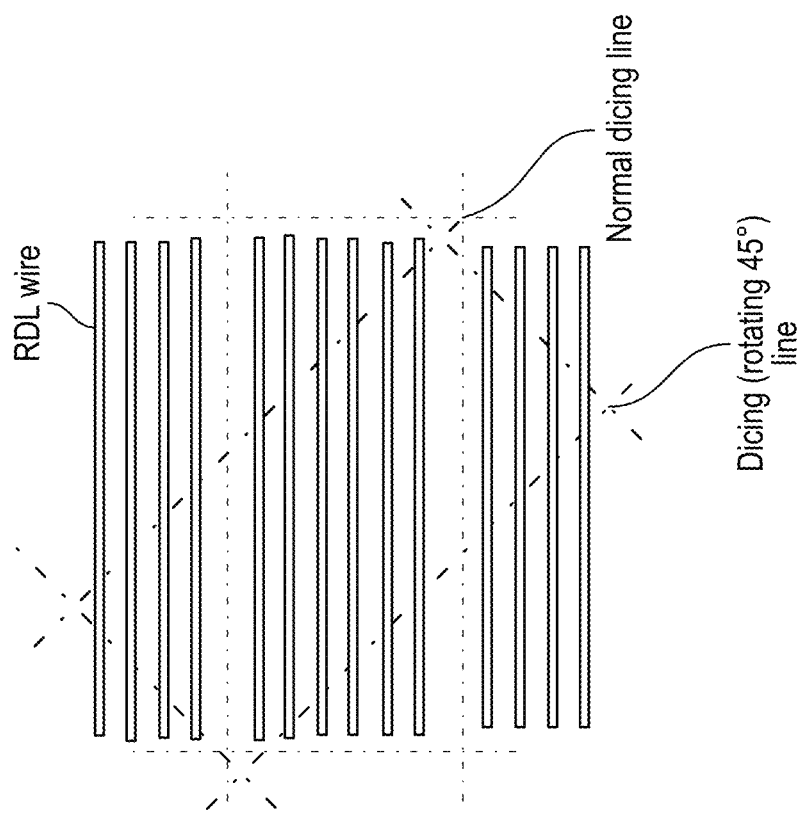
FIG. 3A is a layout diagram of wiring layers of RDLs with a dicing diagonally rotated in a wafer plane with respect the wiring layer of RDLs in a conventional semiconductor device.
Figure 5:
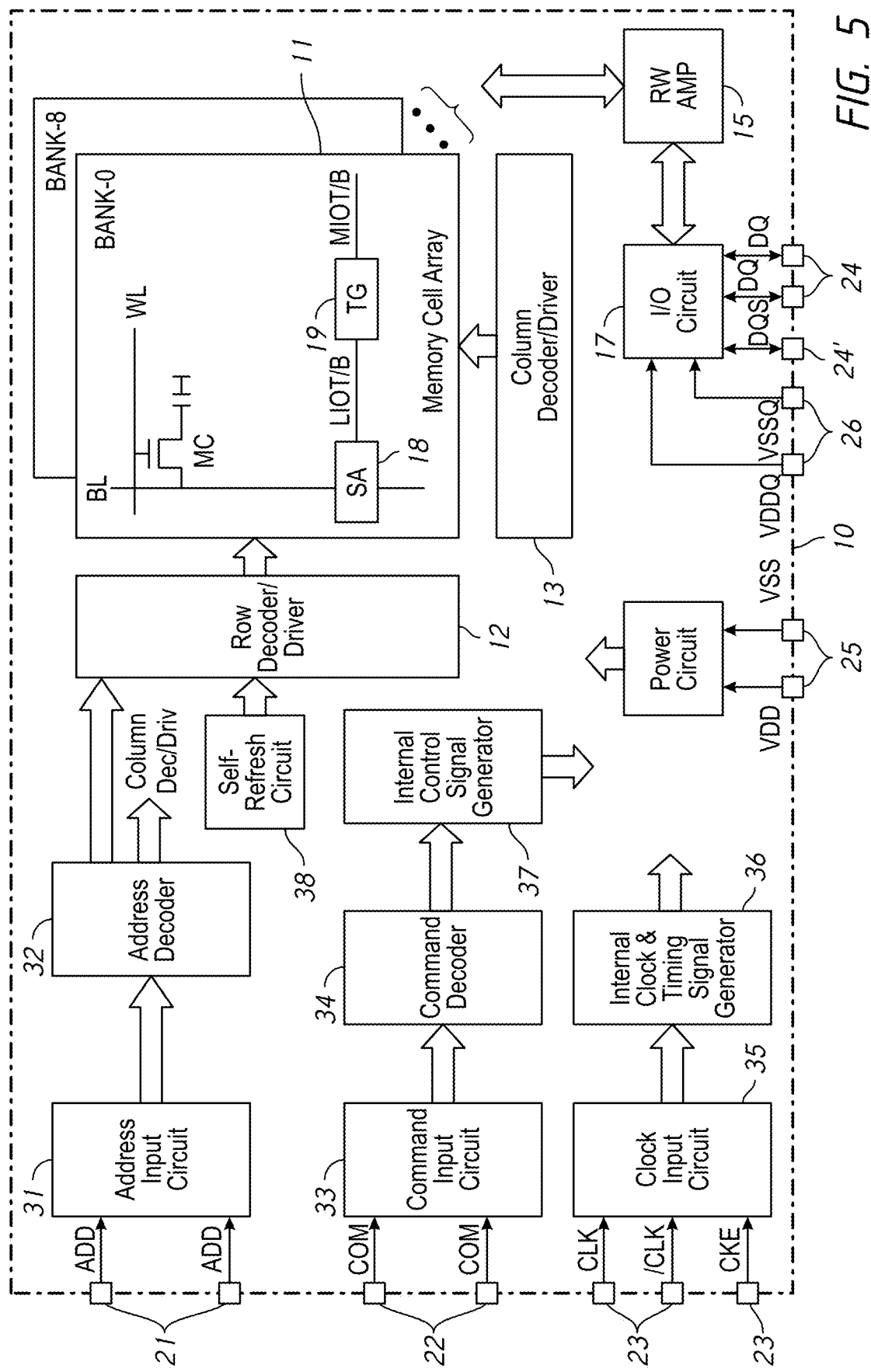
FIG. 5 is a block diagram of a semiconductor device in accordance with the present disclosure.

FIG. 5 is a block diagram of a semiconductor device 10 in accordance with the present disclosure. The semiconductor device 10 is an apparatus, that may be a synchronous dynamic random-access memory (SDRAM) integrated into a single semiconductor chip (e.g., a semiconductor die), for example. The semiconductor device 10 may be mounted on an external substrate that is a memory module substrate, a mother board or the like. As shown in FIG. 3, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder/driver 12 and the selection of the bit line BL is performed by a column decoder/driver 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, a clock enable terminal 23', data terminals 24, a data strobe terminal 24', power supply terminals 25 and 26. The data terminals 24 may be coupled to output buffers for read operations of memories. Alternatively, the data terminals 24 may be coupled to input buffers for read/write access of the memories responsive to a data strobe signal provided at the data strobe terminal 24'. FIG. 3 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder/driver 12, and a decoded column address signal YADD to the column decoder/driver 13. The address decoder 32 also receives the bank address signal BADD and supplies the bank address signal BADD to the row decoder/driver 12, the column decoder/driver 13. In a self-refresh mode, a self-refresh circuit 38 may provide a row address signal to the row/decoder driver 12 for self-refresh operation.

The command terminals 22 are supplied with a command signal COM. The command signal COM may include one or more separate signals. The command signal COM input to the command terminals 22 is provided to a command decoder 34 via a command input circuit 33. The command decoder 34 decodes the command signal COM and provides the decoded command, and an internal control signal generator 37 may generate various internal command signals responsive to the decoded command from the command decoder 34. For example, the internal commands may include a row command signal to select a word line and a column command signal, such as a read command or a write command, to select a bit line.

Accordingly, when a read command is issued and a row address and a column address are timely supplied with the read command, read data is read from a memory cell MC in the memory cell array 1 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35 with a clock enable signal CKE received at the clock enable terminal 23'. The clock input circuit 35 receives the external clock signals CK and /CK and the clock enable signal CKE and generates an internal clock signal ICLK. The internal clock signal ICLK is supplied to an internal clock and timing generator 36 and thus a phase controlled internal clock signal LCLK is generated based on the received internal clock signal ICLK. Although not limited thereto, a DLL circuit can be used as the internal clock and timing generator 36. The phase controlled internal clock signal LCLK is supplied to the input/output circuit 17 and is used as a timing signal for determining an output timing of the read data DQ. The internal clock and timing generator 36 may further generate various internal clock signals.

The power supply terminals 25 are supplied with power supply potentials VDD and VSS. These power supply potentials VDD and VSS are supplied to a power circuit 39. The power circuit 39 generates various internal potentials VPP, VOD, VARY, VPERI, and the like. The internal potential VPP is mainly used in the row decoder/driver 12, the internal potentials VOD and VARY are mainly used in the sense amplifiers 18 included in the memory cell array 11, and the internal potential VPERI is used in many other circuit blocks. The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the power supply potentials VDDQ and VSSQ may be used for the input/output circuit 17 so that power supply noise generated by the input/output circuit 17 does not propagate to the other circuit blocks.

Figures 6, 7A:
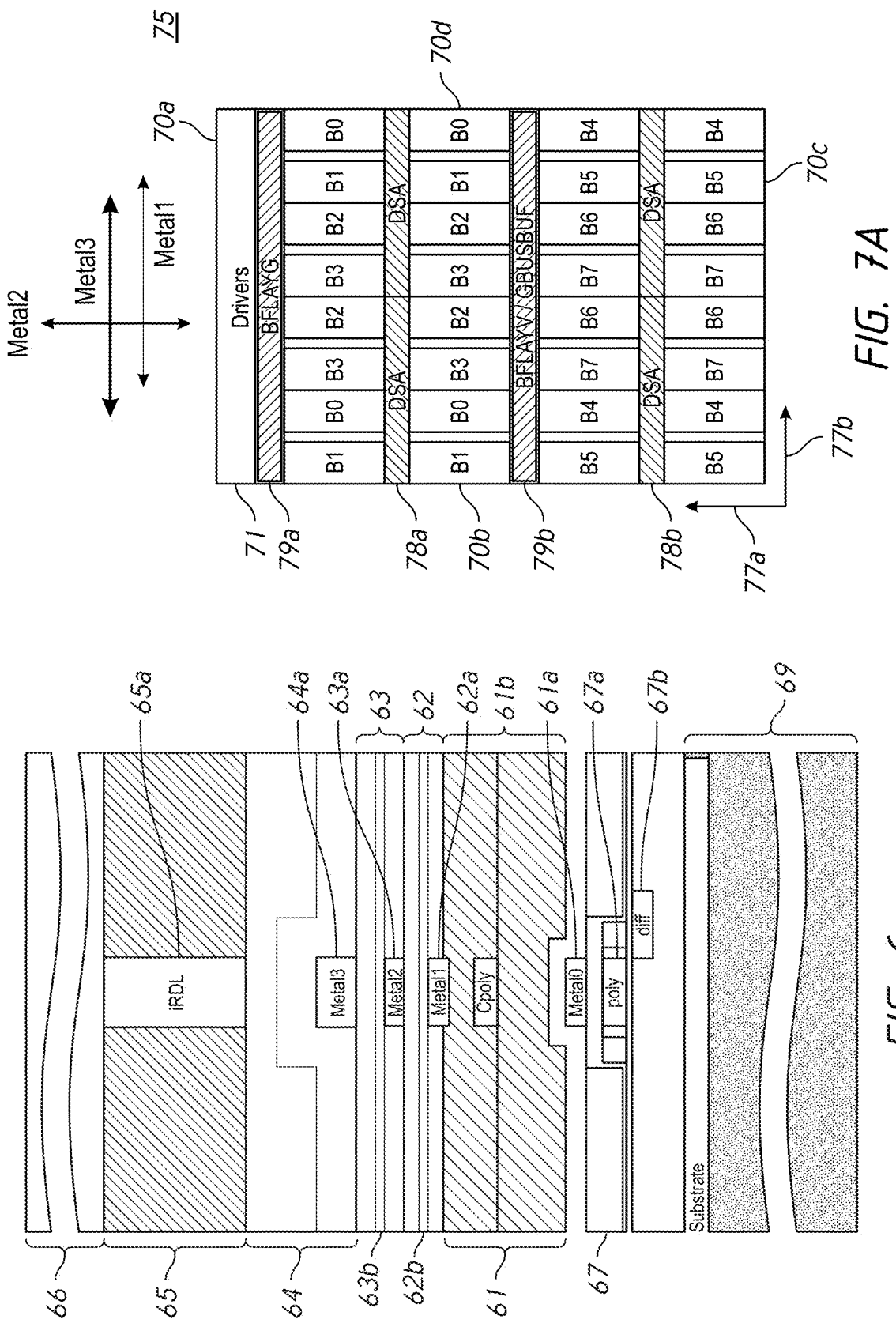
FIG. 6 is a schematic diagram of circuits in metal layers in the semiconductor device in accordance with the present disclosure.
FIG. 7A is a layout diagram of example memory banks and circuit regions a memory device in the semiconductor device in accordance with an embodiment of the present disclosure.

FIG. 6 is a schematic diagram of circuits in metal layers in the semiconductor device in accordance with the present disclosure. For example, FIG. 6 may be a sectional view of the circuits in the metal layers around external terminals in the semiconductor device 10 in FIG. 5. The semiconductor device 10 may include a semiconductor substrate 69, insulating material 67 that insulates the semiconductor substrate 69 and a plurality of wiring layers in a multi-level wiring structure on the semiconductor substrate, including first to fifth level wiring layers 61 to 65 and a passivation layer 66. Each layer of the first to fourth level wiring layers 61 to 64 may include a metal layer to form conductive wirings and an interlayer insulating film as an insulator to isolate the metal layer from metal layers of other wiring layers. A circuit component in the metal layer and another component in the metal layer of another wiring layer may be coupled by a contact plug and/or conductive via. The input/output circuit 17 in FIG. 5 between data terminals 24 (e.g., DQ and DM pads) and the memory cell array 11 may be provided through the first to fourth level wiring layers 61 to 64.

Table 1 shows examples of materials and thicknesses of wiring layers.

TABLE 1

| Level of wiring layer | Material | Thickness (um) |
| --- | --- | --- |
| 1st level wiring layer | Metal0: Tungsten | 0.02 |
| 2nd level wiring layer | Metal1: Copper | 0.2 |
| 3rd level wiring layer | Metal2: Aluminum | 0.3 |
| 4th level wiring layer | Metal3: Aluminum | 0.7 |
| Internal redistribution layer (iRDL) | iRDL: Aluminum | 4.6 |

For example, a gate 67a, typically made of a polycrystalline silicon layer of transistors in the input/output circuit 17 may be disposed in the insulating material 67, and source/drain diffusions (a source or drain region) 67b of the transistors may be disposed in the semiconductor substrate 69. One of the source/drain diffusions 67b may be coupled to a circuit component made of a high conductivity metal layer (Metal1, of a high conductivity material, such as Copper) 62a in the second level wiring layer 62 via a component of a low conductivity metal layer (Metal0, of a low conductivity material, such as Tungsten) 61a and a conductive plug (not shown). The circuit component in the metal layer (Metal1) 62a may be coupled to a conductor made of the metal layer (Metal0) 61a. The metal layer (Metal0) 61a is typically very thin with high impedance, such as Tungsten, that is disposed in the first level wiring layer 61 via another contact plug (not shown). A first interlayer insulating film 61b may be a cap layer (e.g., Cpoly, an upper layer of cylinder cap) that covers a conductor (e.g. a wiring layer or a circuit component) made of the metal layer (Metal0) 61a. A second interlayer insulating film 62b may cover a conductor (e.g. a wiring layer or a circuit component) made of the metal layer (Metal1) 62a. A third interlayer insulating film 63b may cover a conductor (e.g. a wiring layer or a circuit component) made of the metal layer (Metal2) 63a. For example, the metal layer (Metal2) 63a may be made of a mid-level conductive material, such as aluminum with a thickness of approximately 0.3 um. A fourth interlayer insulating film 64b may cover a conductor (e.g., a wiring layer or a circuit component) made of the metal layer (Metal3) 64a. For example, the metal layer (Metal3) 64a may be made of a mid-level conductive material, such as aluminum with a thickness of approximately 0.7 um. The source or drain region 67b of the transistor in the input/output circuit 17 in the semiconductor substrate 69 may be coupled to the conductor (e.g., the wiring layer or the circuit component) 64a in the fourth level wiring layer 64 through the first to fourth level wiring layers 61 to 64 via contact plugs (not shown).

The fourth level wiring layer 64 may include the fourth interlayer insulating film 64b, typically very thick, covering the metal layer (Metal3) 64a. The fifth level wiring layer 65 may be made of a redistribution layer (e.g., an internal redistribution layer (iRDL)) 65a that is an uppermost wiring layer (e.g., an uppermost metal layer) formed on the interlayer insulating film at the fourth level wiring layer 64. For example, the redistribution layer 65a may be made of a mid-level conductive material, such as aluminum with a thickness of approximately 4.6 um. For example, a conductor made of the redistribution layer 65a may have greater width and thickness than these of the other metal layers 61a, 62a, 63a and 64a in order to reduce impedance of the conductor. Thus the redistribution layer 65*a* may reduce the impedance of circuits and wiring layers in the semiconductor device 10 that are coupled to the external terminals 24. For example, a pad (e.g., the data terminal 24) may be disposed on the conductor made of the redistribution layer 65*a*, surrounded by a passivation layer 66 made of polyimide (PI).

Figure 7B:
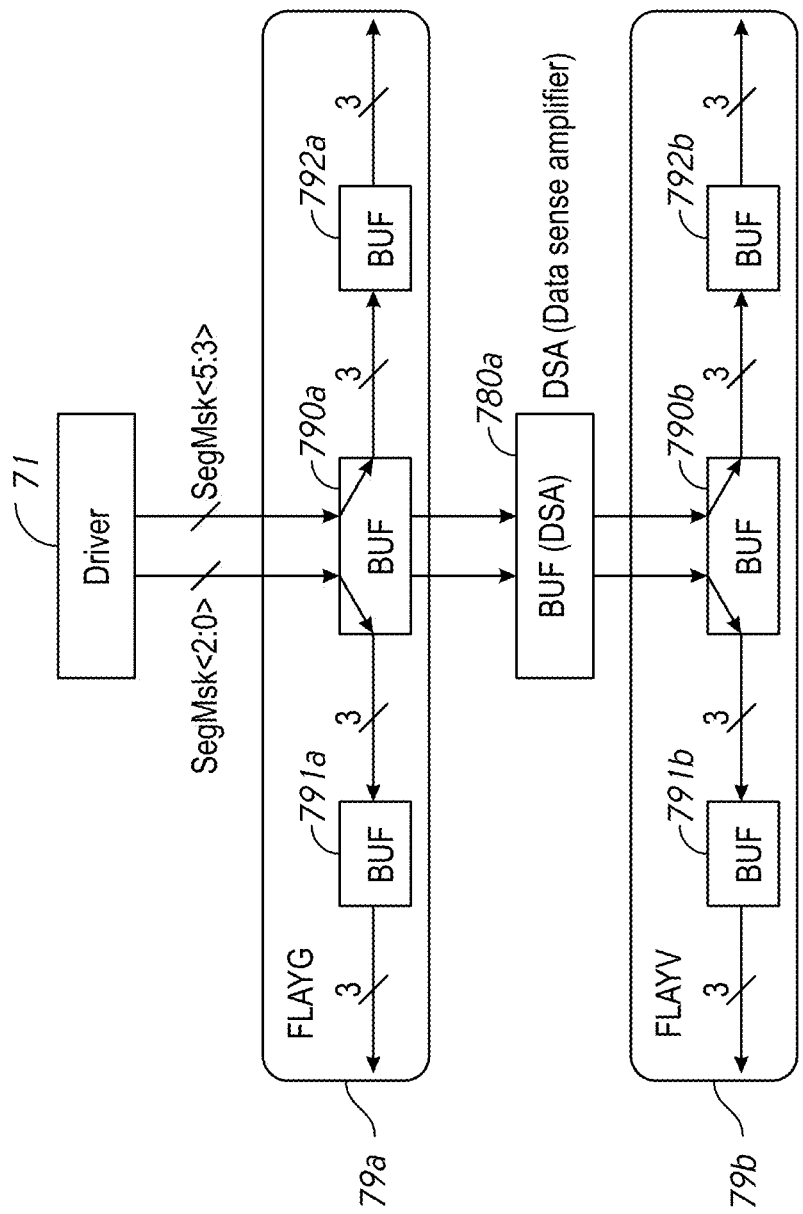
FIG. 7B is a schematic diagram of a portion of circuits in the circuit regions in the memory device in accordance with an embodiment of the present disclosure.

FIG. 7A is a layout diagram of example memory banks and circuit regions of a memory device 75 in the semiconductor device 10 in accordance with an embodiment of the present disclosure. The memory device 75 may be a memory cell array 11 in FIG. 5, including sides 70*b* and 70*d* extending in a first direction 77*a* and 70*a* and 70*c* extending in a second direction 77*b*. Some metal layers (e.g., the metal layers Metal1 62*a* and Metal3 64*a*) may extend in the second direction 77*b* and some metal layers (e.g., the metal layer Metal2 63*a*) may extend in the first direction 77*a*. The memory device 75 may include drivers 71, such as wordline drivers, a circuit region BFLAYG 79*a* (e.g., a FLAY region including logic circuits), memory banks (e.g., B0, B1, B2, B3) divided by a data sense amplifier region DSA 78*a* in the first direction 77*a*, a circuit region BFLAYV/GBUSBUF 79*b* (e.g., a FLAY region including logic circuits and global bus buffers GBUSBUF), memory banks (e.g., B4, B5, B6, B7), divided by a data sense amplifier region DSA 78*b* in the first direction 77*a*. FIG. 7B is a schematic diagram of a portion of circuits in the circuit regions in the memory device 75 in accordance with an embodiment of the present disclosure. For example, the drivers 71 may provide segment masking information signals of six bits, SegMsk<5:0> to a buffer BUF 790*a* in the FLAYG region 79*a*. The buffer BUF 790*a* may divide the segment masking information signals SegMsk <5:0> into two 3-bits signals SegMsk<2:0> and SegMsk<5:3> and may provide the segment masking information signals SegMsk<2:0> and SegMsk<5:3> to buffers BUF 791*a* and 792*a*, respectively. The buffer BUF 790*a* may provide the segment masking information signals SegMsk <5:0> to a buffer BUF(DSA) 780*a* that is a data sense amplifier (DSA) which provides the received the segment masking information signals SegMsk <5:0> to a buffer BUF 790*b* in the FLAYV region 79*b*. The buffer BUF 790*b* may divide the segment masking information signals SegMsk <5:0> into two 3-bits signals SegMsk<2:0> and SegMsk<5:3> and may provide the segment masking information signals SegMsk<2:0> and SegMsk<5:3> to buffers BUF 791*b* and 792*b*, respectively.

Figure 8B:
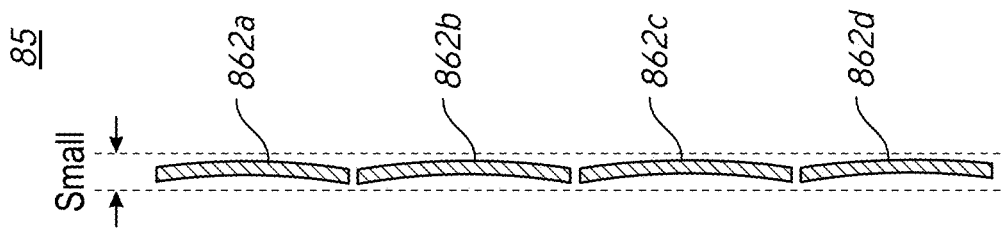
FIG. 8B is a schematic diagram of the uppermost wiring layer in the semiconductor device in accordance with an embodiment of the present disclosure.
Figure 8A:
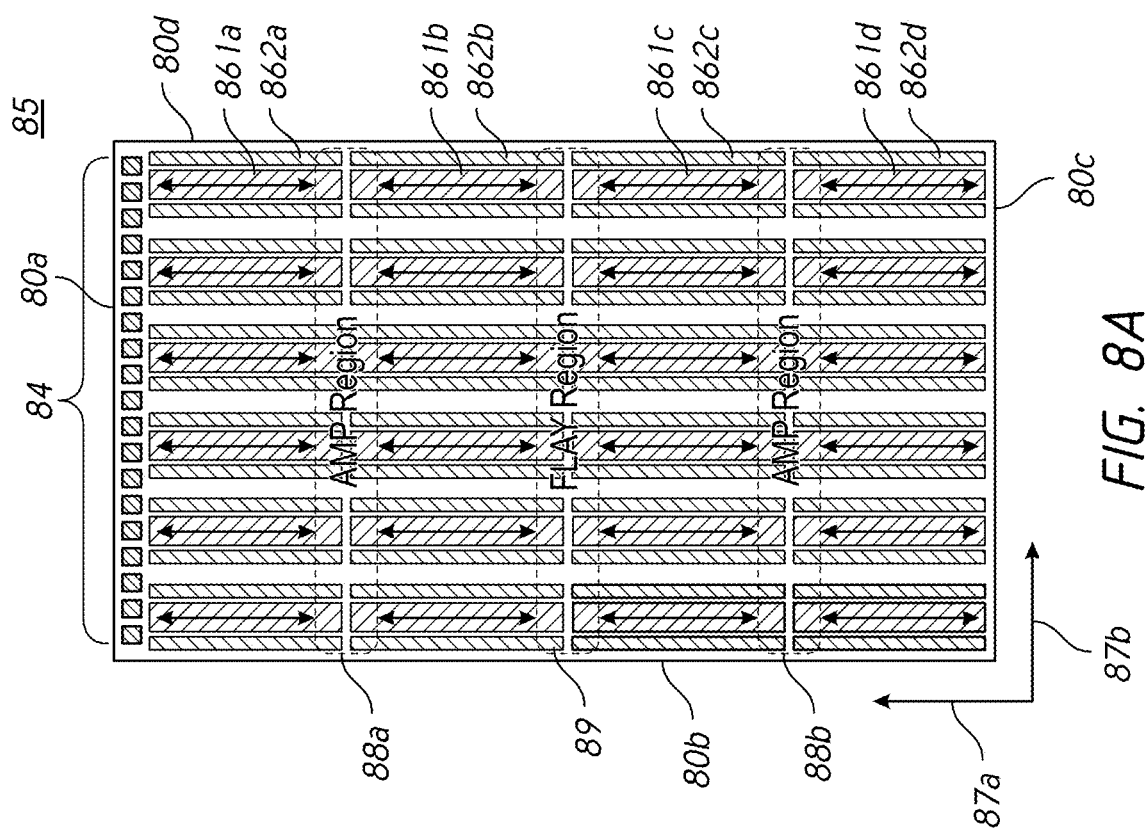
FIG. 8A is a layout diagram of an uppermost wiring layer in the semiconductor device in accordance with an embodiment of the present disclosure.

FIG. 8A is a layout diagram of an uppermost wiring layer 85 in the semiconductor device 10 in accordance with an embodiment of the present disclosure. For example, FIG. 8A may be a plan view of an uppermost wiring layer 85 (e.g., the fifth level wiring layer 65) of the semiconductor device 10. The semiconductor device 10 may have sides 80*a* to 80*d*. The sides 80*b* and 80*d* opposite to each other with respect to the uppermost wiring layer 85, extending in a first direction 87*a*. The sides 80*a* and 80*c* opposite to each other with respect to the uppermost wiring layer 85, extending in a second direction 87*b*, which is perpendicular to the first direction 87*a*. The uppermost wiring layer 85 may include wiring layers made of a redistribution layer (e.g., an internal redistribution layer (iRDL)) extending along a first direction 87*a* in parallel to the sides 80*b* and 80*d*. For example, the semiconductor device 10 including the uppermost wiring layer 85 may be a one-channel mobile dynamic random access memory (DRAM). Thus the uppermost wiring layer 85 may include a plurality of pads 84 (e.g., the external terminals 24) that are arranged in the second direction 87*b* along the side 80. Alternatively, if the semiconductor device 10 is a two-channel mobile memory, which may include the plurality of pads 84 arranged in the second direction 87*b* along the sides 80*a* and 80*c* extending in the second direction 87*b* in parallel.

The wiring layers made of the redistribution layer in the uppermost wiring layer 85 may include wiring layers 861*a* to 861*d* and wiring layers 862*a* to 862*d*. The wiring layers 861*a* to 861*d* may provide a power supply voltage VDD from a power pad 84 that receives the power supply voltage VDD. The wiring layers 862*a* to 862*d* may provide a power supply voltage VSS (e.g., a ground voltage) that is lower than the power supply voltage VDD from another power pad 84 that receives the power supply voltage VSS. The wiring layers 861*a* to 861*d* and 862*a* to 862*d* for providing the power supply voltage VDD and VSS may have greater thicknesses than other power supply wires (e.g., power supply wire that provides a partial power supply voltage VDD2) that may be coupled to another wiring layers of RDLs.

The wiring layer 861*a* may be coupled (e.g., interconnected) to the wiring layer 861*b* via one of lower metal layers, the metal layer (Metal3) 64*a*, the metal layer (Metal1) 63*a*, the metal layer (Metal1) 62*a*, different from the RDL in the uppermost wiring layer, in a cut portion 88*a* over an amplifier (AMP) region. The wiring layer 861*b* may be coupled to the wiring layer 861*c* via one of the lower metal layers in a cut portion 89 over a FLAY region and the wiring layer 861*c* may be coupled to the wiring layer 861*d* via one of the lower metal layers in a cut portion 88*b* over an AMP region. Thus, voltages, such as the power supply voltages VDD and VSS may be provided to amplifiers in the AMP regions 88*a* and 88*b* and logic circuits in the FLAY region 89 via the wiring layers 861*a* to 861*d* and the wiring layers 862*a* to 862*d* in the retribution layer. The warpage due to the stress can be reduced and alleviated by dividing the wiring layers. In FIG. 8A, the cut portions where the wiring layers of the RDLs may be coupled via one of the lower metal layers may be included over the AMP region and the FLAY region, however, the cut portions may be included over a region including fuses (FUSE region), a region including decoders (DEC region).

Figure 4B:
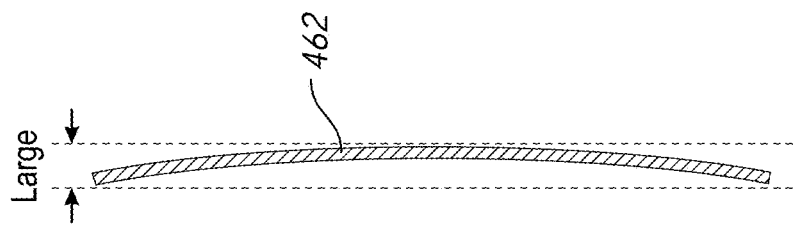
FIG. 4B is a schematic diagram of the uppermost wiring layer in the conventional semiconductor device.
Figure 4A:
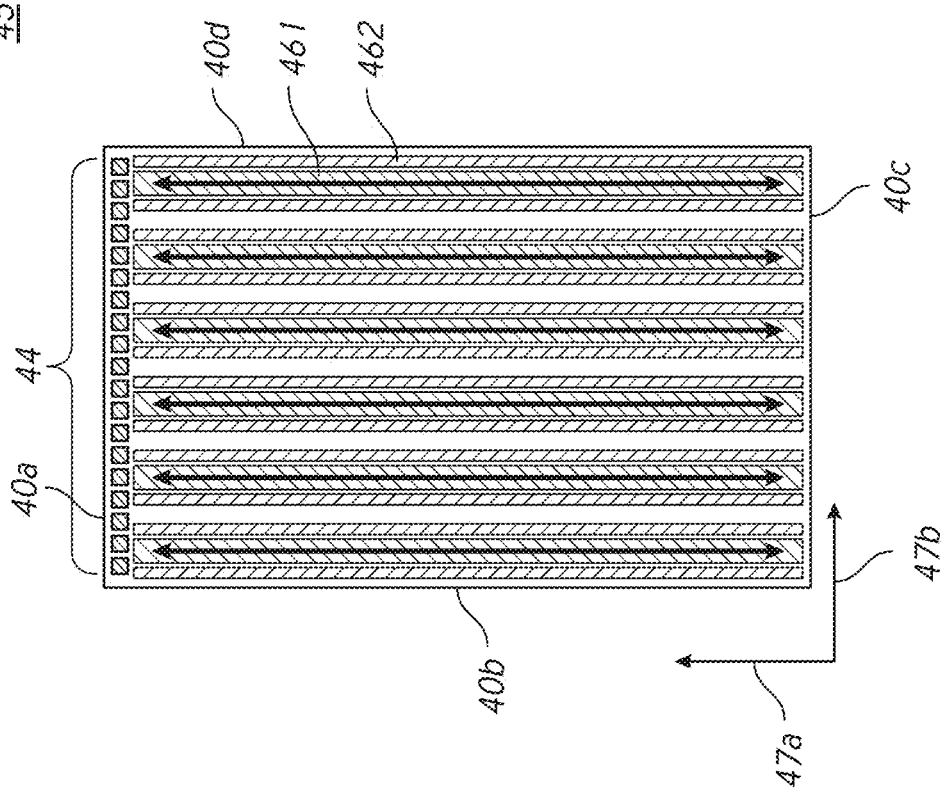
FIG. 4A is a layout diagram of an uppermost wiring layer in a conventional semiconductor device.

FIG. 8B is a schematic diagram of the upper most wiring layer 85 of the semiconductor device in accordance with an embodiment of the present disclosure. FIG. 8B may be a side view of the uppermost wiring layer 85 (e.g., the fifth level wiring layer 65) of the semiconductor device 10. Because the pad 84 in FIG. 8A is coupled to the wiring layers 862*a* to 862*d* to provide the power supply voltage VSS, unlike in FIG. 4B having one wiring layer 462 to provide the power supply voltage VSS, a total warpage due to distortion of wiring layers 862*a* to 862*d* from stress is smaller than a warpage due to distortion of the wiring layer 462 from stress accumulated through the entire wiring layer 462. Thus, by dividing a wiring layer that provides a power supply voltage into a plurality of wiring layers (e.g., the wiring layers 862*a* to 862*d*) by intervening cut portions (e.g., the AMP regions 88*a* and 88*b*, the FLAY region 89), the warpage due to the stress can be reduced.

FIG. 9A is a layout diagram of wiring layers of RDLs in the semiconductor device 10 in accordance with an embodiment of the present disclosure. For example, FIG. 9A may be a plan view of an uppermost wiring layer 95 (e.g., the fifth level wiring layer 65) of the semiconductor device 10. The semiconductor device 10 may have sides 90*a* to 90*d*. The sides 90*b* and 90*d* opposite to each other with respect to the uppermost wiring layer 95, extending in a first direction 97*a* between the sides 90*a* and 90*c*. The sides 90*a* and 90*c* opposite to each other with respect to the uppermost wiring layer 95, extending in a second direction 97b, which is perpendicular to the first direction 97a. The uppermost wiring layer 95 may include wiring layers made of a redistribution layer (e.g., an internal redistribution layer (iRDL)) extending along a first direction 97a in parallel to the sides 90b and 90d. For example, the semiconductor device 10 including the uppermost wiring layer 95 may be a one-channel mobile dynamic random access memory (DRAM). Thus the uppermost wiring layer 95 may include a plurality of pads 94 (e.g., the external terminals 24) that are arranged in the second direction 97b along the side 90a. Alternatively, if the semiconductor device 10 is a two-channel mobile memory, which may include the plurality of pads 94 arranged in the second direction 97b along the sides 90a and 90c extending in the second direction 87b in parallel.

The wiring layers of RDLs in the uppermost wiring layer 95 may include a first group of wiring layers 961a to 961d and a second group of wiring layers 962a to 962d. The first group of wiring layers 961a to 961d may provide a power supply voltage VDD from a power pad 94 that receives the power supply voltage VDD. The second group of wiring layers 962a to 962d may provide a power supply voltage VSS (e.g., a ground voltage) that is lower than the power supply voltage VDD from another power pad 94 that receives the power supply voltage VSS. The wiring layers 961a to 961d and 962a to 962d for providing the power supply voltage VDD and VSS may have greater thicknesses than other power supply wiring layers (e.g., power supply wiring layers that provides a partial power supply voltage VDD2) that may be coupled to another wiring layers in the redistribution layer. The first group of wiring layers 961a to 961d are arranged in line in the first direction 97a and the second group of wiring layers 962a to 962d are arranged in line in the first direction 97a.

FIG. 9B is a layout diagram of a cut portion 98 coupling the wiring layers of RDLs in the semiconductor device 10 in accordance with an embodiment of the present disclosure. In an embodiment of the disclosure, the wiring layer 961b and the wiring layer 961c are and completely separated. For example, the wiring layer 961b and the wiring layer 961c are in the same layer (e.g., the iRDL 65a) and the wiring layer 961b is apart from the wiring layer 961c. The wiring layer 961b may be coupled (e.g., interconnected) to the wiring layer 961c through one of lower metal layers, the metal layer (Metal3) 64a, the metal layer (Metal2) 63a, the metal layer (Metal1) 62a. A cut portion 981 is a sub portion of the cut portion 98 disposed between the wiring layer 961b and the wiring layer 961c viewed from a third direction perpendicular to the first direction 97a and the second direction 97b. Thus, the wiring layer 961b and the wiring layer 961c are separated from each other by the cut portion 981. The wiring layer 961b may be coupled to the one lower metal layer through via 911b in the cut portion 981. The wiring layer 961c may be coupled to the one lower metal layer through via 911c in the cut portion 981. Similarly, the wiring layer 962b may be coupled (e.g., interconnected) to the wiring layer 962c through one of lower metal layers, the metal layer (Metal3) 64a, the metal layer (Metal2) 63a, the metal layer (Metal1) 62a. A cut portion 982 is a sub portion of the cut portion 98 disposed between the wiring layer 962b and the wiring layer 962c viewed from the third direction. Thus, the wiring layer 962b and the wiring layer 962c are separated from each other by the cut portion 982. The wiring layer 962b may be coupled to the one lower metal layer through via 912b in the cut portion 982. The wiring layer 962c may be coupled to the one lower metal layer through via 912c in the cut portion 982.

Furthermore, a portion of the wiring layer 961b may extend to the cut portion 982 in the uppermost wiring layer 95 and coupled to another wiring layer 961b, while a portion of the wiring layer 962b is coupled to the one lower metal layer through via 912b. A portion of the wiring layer 962c may extend to the cut portion 981 in the uppermost wiring layer 95 and coupled to another wiring layer 962c, while a portion of the wiring layer 961c is coupled to the one lower metal layer through via 911c.

FIG. 10A is a layout diagram of wiring layers of RDLs in the semiconductor device 10 in accordance with an embodiment of the present disclosure. For example, FIG. 10A may be a plan view of an uppermost wiring layer 105 (e.g., the fifth level wiring layer 65) of the semiconductor device 10. The semiconductor device 10 may have sides 100a to 100d. The sides 100b and 100d opposite to each other with respect to the uppermost wiring layer 105, extending in a first direction 107a between the sides 100a and 100c. The sides 100a and 100c opposite to each other with respect to the uppermost wiring layer 105, extending in a second direction 107b, which is perpendicular to the first direction 107a. The uppermost wiring layer 105 may include wiring layers made of a redistribution layer (e.g., an internal redistribution layer (iRDL)) extending along a first direction 107a in parallel to the sides 100b and 100d. For example, the semiconductor device 10 including the uppermost wiring layer 105 may be a one-channel mobile dynamic random access memory (DRAM). Thus the uppermost wiring layer 105 may include a plurality of pads 104 (e.g., the external terminals 24) that are arranged in the second direction 107b along the side 100a. Alternatively, if the semiconductor device 10 may be a two-channel mobile memory, which may include the plurality of pads 104 arranged in the second direction 107b along the sides 100a and 100c extending in the second direction 107b in parallel.

The wiring layers of RDLs in the uppermost wiring layer 105 may include a first group of wiring layers 1061a to 1061d and a second group of wiring layers 1062a to 1062d. The first group of wiring layers 1061a to 1061d may provide a power supply voltage VDD from a power pad 104 that receives the power supply voltage VDD. The second group of wiring layers 1062a to 1062d may provide a power supply voltage VSS (e.g., a ground voltage) that is lower than the power supply voltage VDD from another power pad 104 that receives the power supply voltage VSS. The wiring layers 1061a to 1061d and 1062a to 1062d for providing the power supply voltage VDD and VSS may have greater thicknesses than other power supply wiring layers (e.g., power supply wiring layers that provides a partial power supply voltage VDD2) that may be coupled to another wiring layers in the redistribution layer. The first group of wiring layers and the second group of wiring layers are arrange alternately in the first direction. For example, the wiring layers 1061a, 1062b, 1061c, and 1062d may be arranged in the first direction 107a in this order. The wiring layers 1062a, 1061b, 1062c and 1061d may be arranged in the first direction 107a in this order, in parallel to the wiring layers 1061a, 1062b, 1061c, and 1062d. Thus, each group of wiring layers provide a pattern of a non-linear shape and each line includes wiring layers of alternating groups having at least partially alternating polarities.

FIG. 10B is a layout diagram of a cut portion 108 coupling the wiring layers of RDLs in the semiconductor device 10 in accordance with an embodiment of the present disclosure.

The wiring layer 1061*b* may be coupled (e.g., interconnected) to the wiring layer 1061*c* through one of lower metal layers, the metal layer (Metal3) 64*a*, the metal layer (Metal2) 63*a*, the metal layer (Metal1) 62*a*. The cut portion 108 is disposed between the wiring layers 1061*b*, 1062*b* and the wiring layer 1061*c*, 1062*c* viewed from a third direction perpendicular to the first direction 107*a* and the second direction 107*b*. Thus, the wiring layer 1061*b* and the wiring layer 1061*c* are separated from each other by the cut portion 108. The wiring layer 1061*b* may be coupled to the one lower metal layer through via 1011*b* in the cut portion 108. The wiring layer 1061*c* may be coupled to the one lower metal layer through via 1011*c* in the cut portion 108. Furthermore, the wiring layer 1062*b* and the wiring layer 1062*c* may be coupled to each other via a bridge 1062*d* of the same RDL with the second group of wiring layers 1062*b* and 1062*c* across lines in the cut portion 108 in the uppermost wiring layer 105. Thus, the second group of wiring layers 1062*b* and 1062*c* may be partially separated across lines, however, the wiring layers 1062*b* and 1062*c* are still commonly connected to one another by the bridge 1062*d*.

FIG. 11A is a layout diagram of wiring layers of RDLs in the semiconductor device 10 in accordance with an embodiment of the present disclosure. Components of an uppermost wiring layer 1105 may include components similar to the uppermost wiring layer 95 of FIG. 9A, and elements previously described are referenced using common last two digits of reference numbers. As such, a detailed description of functionality of components in the uppermost wiring layer 1105 will not be repeated for FIG. 11 in the interest of brevity. The uppermost wiring layer 95 may further include a cut portion 118 between the wiring layers 1161*b*, 1162*b* and the wiring layers 1161*c* and 1162*c*. FIG. 11B is a layout diagram of the cut portion 118 coupling the wiring layers of RDLs in the semiconductor device 10 in accordance with an embodiment of the present disclosure. The cut portion 118 may include slits 11*/*3*c* arranged in a direction 117*b* in parallel to an extending direction of sides 110*a* and 110*c* of the uppermost layer 115, shorter than sides 110*b* and 110*d* extending in a direction 117*a*. The slits 1113*c* may be between thin wires 1111*b*, having a width less than the width of the first group of wiring layer of RDL 161*b* and 1161*c*, that couples the first group of wiring layer of RDL 1161*b* and 1161*c*. Similarly, the cut portion 118 may also include a slit 1113*b* arranged with the slits 1113*c* in the direction 117*b*. The slit 1113*b* may be between thin wires 1111*c*, having a width less than the width of the second group of wiring layer of RDL 1162*b* and 1162*c*, coupling the second group of wiring layer of RDL 1162*b* and 1162*c*. For example, the slits 1113*b* and 1113*c* may be formed by a passivation layer made of polyimide (PI). Thus, the first group of wiring layers of RDL 1161*b* and 1161*c* may be partially separated and the second group of wiring layers of RDL 1162*b* and 1162 maybe also partially separated. Thus, in the cut portion 118, coupling wiring layers of the same RDL may be reduced in width. Thus, each group of wiring layers of a pattern in line between two opposite sides may have several portions partially reduced in width.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present disclosure herein should not be limited by the particular disclosed embodiments described above.

What is claimed is:

1. An apparatus comprising:
   a semiconductor substrate defined by first and second sides opposite to each other;
   a plurality of pads provided along the first side of the semiconductor substrate; and
   a plurality of wiring layers including a plurality of groups of wiring layers, each group of wiring layers of the plurality of groups wiring layers extending from an associated one of the plurality of pads toward the second side of the semiconductor substrate,
   wherein each group of wiring layers includes:
      at least one cut portion between the first and second sides of the semiconductor substrate; and
   wherein a first group of wiring layers of the plurality of groups of wiring layers completely separated by the cut portion and a second group of wiring layers of the plurality of groups of wiring layers partially separated by the cut portion.

2. The apparatus of claim 1, further comprising a region where amplifier circuits are provided over the semiconductor substrate,
   wherein the cut portion is provided over the region.

3. The apparatus of claim 1, further comprising a region where logic circuits are provided over the semiconductor substrate,
   wherein the cut portion is provided over the region.

4. The apparatus of claim 1, wherein the first wiring layer and the second wiring layer are in a first layer and completely separated by the cut portion, and
   wherein the first wiring layer and the second wiring layer are connected through a third wiring layer in a second layer different from the first layer.

5. The apparatus of claim 4, wherein the first, second and the third wiring layers are arranged in line.

6. The apparatus of claim 1, wherein the first group of plurality of wiring layers and the second group of plurality of wiring layers are arranged alternately and the first group of wiring layers are connected commonly to one another through a different layered wiring layer.

7. The apparatus of claim 1, wherein the second group of wiring layers are connected commonly to one another by a same layered bridge.

8. The apparatus of claim 1, wherein the each of the wiring layers are partially separated.

9. An apparatus comprising:
   a semiconductor chip having a first side and a second side opposite the first side;
   a power pad on the semiconductor chip along the first side and configured to receive a power supply voltage;
   a plurality of wiring layers of a redistribution layer extending from the first side and the second side and configured to provide the power supply voltage from the power pad; and
   a cut portion arranged between a first wiring layer of the plurality of wiring layers and a second wiring layer of the plurality of wiring layers, wherein the cut portion includes:

a metal layer different from the redistribution layer;
a first via coupling the first wiring layer and the metal layer; and
a second via coupling the second wiring layer and the metal layer,
wherein the first wiring layer is coupled to the metal layer and the second wiring layer is coupled to the metal layer.

10. The apparatus of claim 9, wherein the cut portion further includes a bridge coupling the first wiring layer and the second wiring layer.

11. An apparatus comprising:
a semiconductor chip having a first side and a second side opposite the first side:
a power pad on the semiconductor chip along the first side and configured to receive a power supply voltage;
a plurality of wiring layers of a redistribution layer extending from the first side and the second side and configured to provide the power supply voltage from the power pad; and
a cut portion arranged between a first wiring layer of the plurality of wiring layers and a second wiring layer of the plurality of wiring layers, and the cut portion includes a bridge coupling the first wiring layer and the second wiring layer, wherein the plurality of wiring layers are a first group of wiring layers and the redistribution layer is a first redistribution layer, the apparatus further comprising:
a second group of wiring layers of a second redistribution layer extending from the first side and the second side, the second group of wiring layers including a third wiring layer and a fourth wiring layer,
wherein the first wiring layer and the third wiring layer are arranged in a first direction between the first side and the second side across the cut portion, and
wherein the second wiring layer and the fourth wiring layer are arranged in the first direction and parallel to the first wiring layer and the third wiring layer across the cut portion.

12. The apparatus of claim 11, wherein the second group of wiring layers are configured to provide a ground voltage.

13. An apparatus comprising:
a semiconductor chip having a first side and a second side opposite the first side;
a power pad on the semiconductor chip along the first side and configured to receive a power supply voltage;
a plurality of wiring layers of a redistribution layer extending from the first side and the second side and configured to provide the power supply voltage from the power pad; and
a cut portion arranged between a first wiring layer of the plurality of wiring layers and a second wiring layer of the plurality of wiring layers,
wherein the first wiring layer and the second wiring layer are coupled by a wire having a width less than a width of the first wiring layer and the second wiring layer.

14. The apparatus of claim 13, wherein the wire is between slits made of a passivation layer covering the first wiring layer and the second wiring layer.

15. The apparatus of claim 14, wherein the passivation layer is made of polyimide.

16. The apparatus of claim 15, wherein the redistribution layer is made of aluminum.

17. An apparatus comprising:
a substrate;
a first level wiring layer above the substrate;
a second level wiring layer above the first wiring layer;
a first side extending in a first direction;
a second side opposite to the first side extending in the first direction;
a third side longer than the first side and the second side, extending in a second direction perpendicular to the first direction;
a plurality of wiring layers of a redistribution layer in the second level wiring layer extending in the second direction, wherein the plurality of wiring layers includes a first wiring layer, a second wiring layer and a third wiring layer;
a first cut portion arranged between the first wiring layer and the second wiring layer the first cut portion including one of a logic circuit region, a decoder region and an amplifier region on the first metal layer; and
a second cut portion arranged between the second wiring layer and the third wiring layer, the second cut portion including one of the others of the logic circuit region, the decoder region and the amplifier region on the first metal layer.

18. The apparatus of claim 17, wherein the first wiring layer and the second wiring layer are coupled to each other in the first level wiring layer.

19. The apparatus of claim 17, wherein the first wiring layer and the second wiring layer are coupled to each other by a wire of the redistribution layer having a width less than a width of the first and second wiring layers.

20. An apparatus comprising:
a substrate;
a first level wiring layer above the substrate;
a second level wiring layer above the first wiring layer;
a first side extending in a first direction;
a second side opposite to the first side extending in the first direction;
a third side longer than the first side and the second side, extending in a second direction perpendicular to the first direction;
a plurality of wiring layers of a redistribution layer in the second level wiring layer extending in the second direction, wherein the plurality of wiring layers includes a first wiring layer, a second wiring layer and a third wiring layer;
a first cut portion arranged between the first wiring layer and the second wiring layer; and
a second cut portion arranged between the second wiring layer and the third wiring layer, wherein the first wiring layer and the third wiring layer are configured to provide a first power supply voltage, and
wherein the second wiring layer is configured to provide a second power supply voltage different from the first power supply voltage.

* * * * *